(12) United States Patent
Lunceford et al.

(10) Patent No.: US 7,045,381 B1
(45) Date of Patent: *May 16, 2006

(54) CONDUCTIVE ETCH STOP FOR ETCHING A SACRIFICIAL LAYER

(75) Inventors: Brent D. Lunceford, Austin, TX (US); Gregory Beach, Georgetown, TX (US); James A. Hunter, Campbell, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 10/788,565

(22) Filed: Feb. 27, 2004

Related U.S. Application Data

(63) Continuation-in-part of application No. 10/187,028, filed on Jun. 28, 2002, now Pat. No. 6,777,258.

(60) Provisional application No. 60/455,542, filed on Mar. 18, 2003.

(51) Int. Cl.
*H01L 21/00* (2006.01)

(52) U.S. Cl. .......................................... 438/48; 438/52

(58) Field of Classification Search .................. 438/48, 438/52, 685
See application file for complete search history.

(56) References Cited

U.S. PATENT DOCUMENTS

| | | | |
|---|---|---|---|
| 5,661,592 A | 8/1997 | Bornstein et al. | |
| 5,789,264 A | 8/1998 | Chung | |
| 5,998,824 A * | 12/1999 | Lee | 257/309 |
| 6,020,215 A | 2/2000 | Yagi et al. | |
| 6,218,238 B1 * | 4/2001 | Huang et al. | 438/253 |
| 6,238,581 B1 | 5/2001 | Hawkins et al. | |
| 6,290,864 B1 | 9/2001 | Patel et al. | |
| 6,387,723 B1 | 5/2002 | Payne et al. | |
| 6,777,258 B1 * | 8/2004 | Hunter | 438/48 |
| 2002/0019064 A1 | 2/2002 | Hara | |
| 2002/0047172 A1 | 4/2002 | Reid | |
| 2003/0010746 A1 | 1/2003 | Gutierrez et al. | |
| 2003/0030118 A1 | 2/2003 | Kim | |
| 2003/0054588 A1 | 3/2003 | Patel et al. | |
| 2003/0138986 A1 | 7/2003 | Bruner | |

* cited by examiner

*Primary Examiner*—Tuan H. Nguyen
(74) *Attorney, Agent, or Firm*—Okamoto & Benedicto LLP

(57) ABSTRACT

In one embodiment, a method of forming a metallic electrode comprises depositing a metal layer over a surface (e.g., substrate) and thermally processing the metal layer to form a conductive metallized ceramic. The metal layer may be deposited by sputtering and thermally processed by rapid thermal processing, for example. Among other advantages, embodiments of the present invention allow for the formation of conductive metallized ceramics, such as titanium-nitride, without the use of relatively expensive deposition tools.

18 Claims, 13 Drawing Sheets

NITRIDIZATION

ETCHING

CONDUCTIVE ETCH STOP FOR ETCHING A SACRIFICIAL LAYER

REFERENCE TO RELATED APPLICATIONS

The present application claims the benefit of U.S. Provisional Application No. 60/455,542, entitled "Method of Fabricating a Conductive Etch Stop," filed on Mar. 18, 2003 by Brent D. Lunceford, Gregory Beach, and James A. Hunter, which is incorporated herein by reference in its entirety.

The present application is a continuation-in-part of U.S. patent application Ser. No. 10/187,028, entitled "Conductive Etch Stop for Etching Sacrificial Layer," filed on Jun. 28, 2002 now U.S. Pat. No. 6,777,258 by James A. Hunter, which is incorporated herein by reference in its entirety.

BACKGROUND OF THE INVENTION

1. Field of the Invention

The present invention relates generally to material deposition processes, and more particularly, but not exclusively, to micromechanical system structures and manufacturing methods.

2. Description of the Background Art

A micro electromechanical system (MEMS) typically includes micromechanical structures that may be actuated using electrical signals. An example of a MEMS device is the Grating Light Valve™ (GLV) device available from Silicon Light Machines, Inc. of Sunnyvale, Calif. GLV-type devices are described in the following disclosures, which are incorporated herein by reference in their entirety: U.S. Pat. No. 5,311,360 to Bloom et al.; U.S. Pat. No. 5,841,579 to Bloom et al.; and U.S. Pat. No. 5,661,592 to Bornstein et al.

Generally speaking, a GLV-type device is a light modulator. It may be used in various applications including video, printing, and optical switching, for example. A GLV-type device includes an array of moveable structures referred to as "ribbons". A ribbon typically includes a metallic layer formed over a resilient, suspended structure. Under the ribbon is a bottom electrode that works in conjunction with the metallic layer, which serves as a top electrode. An air gap separates the bottom electrode from the metallic layer. Applying a voltage difference between the ribbon and the bottom electrode generates an electrostatic field that pulls the ribbon towards the bottom electrode. Light that impinges on the reflective metallic layer may thus be modulated by reflection or diffraction by controlling the applied voltage.

The response of a GLV-type device to a control signal, such as an applied voltage, is also referred to as its "driving characteristic". As can be appreciated from the foregoing, the better a device's driving characteristic, the better it can modulate light. Thus, it is desirable to have a GLV-type device that has a relatively stable driving characteristic. Furthermore, the selling price of a light modulator takes into account the cost of the manufacturing equipment employed to fabricate the light modulator. Therefore, a technique that would allow for the use of cost-effective manufacturing equipment in the fabrication of a light modulator or other devices would be desirable.

SUMMARY

In one embodiment, a method of forming a metallic electrode comprises depositing a metal layer over a surface (e.g., substrate) and thermally processing the metal layer to form a conductive metallized ceramic. The metal layer may be deposited by sputtering and thermally processed by rapid thermal processing, for example. Among other advantages, embodiments of the present invention allow for the formation of conductive metallized ceramics, such as titanium nitride, without the use of relatively expensive deposition tools.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Moreover, embodiments of the present invention are described herein in the context of a GLV-type device. However, it should be understood that the present invention is not so limited and may also be used in MEMS devices in general or in other micro devices, such as integrated circuits with moveable micromechanical structures or micro systems technology (MST) devices. Additionally, it is to be noted that as used in the present disclosure, the terms "over" and "under" refer to the relative placement of two materials that may or may not be directly in contact with each other; that is, the two materials may be separated by another material or an air gap.

Figure 1:
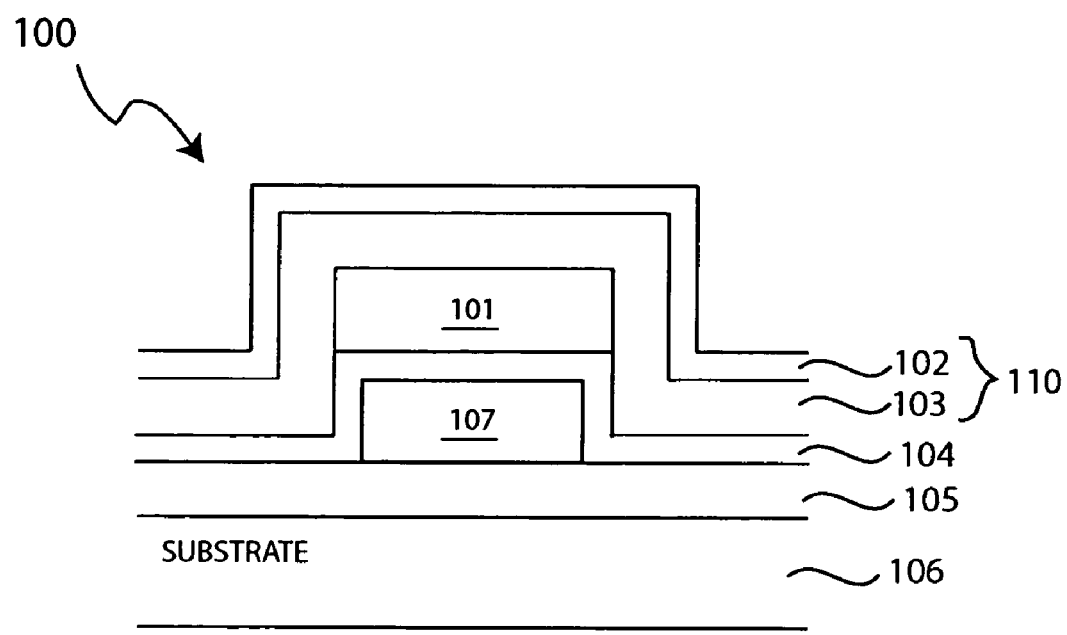
FIG. 1 schematically shows a cross-sectional view of a conventional GLV-type device.

Referring now to FIG. 1, there is shown a schematic representation of a cross-sectional view of a conventional GLV-type device 100. Note that FIG. 1 is not drawn to scale. Also, although a GLV-type device typically includes more than one ribbon, only one ribbon is shown for clarity of illustration.

Device 100 includes a ribbon 110 comprising a resilient structure 103 and a metal layer 102. Metal layer 102 is typically a layer of aluminum, while resilient structure 103 is typically a layer of silicon nitride ($Si_3N_4$). An air gap 101 separates ribbon 110 from a bottom electrode 107. Because ribbon 110 may be flexed towards bottom electrode 107, ribbon 110 may also be referred to as a "moveable structure." Unlike metal layer 102, bottom electrode 107 is typically of a non-metallic material such as polysilicon. The polysilicon is heavily doped with an n-type dopant (e.g., phosphorous) so that it may be used as an electrode. Polysilicon is traditionally thought of as a good electrode material because it is compatible with standard integrated circuit fabrication processes. Additionally, polysilicon is stable at least up to 550° C., the temperature at which an amorphous silicon layer is deposited over bottom electrode 107, as discussed below.

Air gap 101 is typically formed by depositing amorphous silicon in the space occupied by air gap 101, and then isotropically etching the amorphous silicon with xenon difluoride ($XeF_2$). The amorphous silicon is deposited over bottom electrode 107 using a low pressure chemical vapor deposition process at around 550° C. To protect a polysilicon bottom electrode 107 during the etching of the amorphous silicon, a thin silicon dioxide ($SiO_2$) layer 104 is deposited over bottom electrode 107. That is, silicon dioxide layer 104 serves as an etch stop for the amorphous silicon etch. As shown in FIG. 1, bottom electrode 107 is formed over an isolation layer 105 (e.g., silicon dioxide), which in turn is over a substrate 106 (e.g., silicon substrate).

The movement of ribbon 110 may be controlled by applying a voltage difference between ribbon 110 and bottom electrode 107. The voltage difference generates an electric field that pulls ribbon 110 towards bottom electrode 107. Because metal layer 102 is formed of a metallic material that is smooth to light of a particular wavelength or range of wavelengths, incident light of suitable wavelength may be diffracted or reflected off metal layer 102 depending on whether ribbon 110 is pulled or not.

Although device 100 is suitable for most applications, its driving characteristics may change over time. That is, applying the same voltage difference at different time periods may not result in the same movement of ribbon 110. The inventor has discovered that the use of a non-conductive etch stop (i.e., silicon dioxide layer 104) over bottom electrode 107 contributes to this problem. Because the non-conductive etch stop is a dielectric, random ionic charges may build up on the surface of bottom electrode 107 facing the etch-stop. The charge build up may block electric fields generated to move ribbon 110, thereby adversely affecting the driving characteristics of device 100. In an embodiment of the present invention, a bottom electrode is of a metallic material. The metallic material also serves as a conductive etch stop to prevent undesirable charge build up.

FIGS. 2(a)–2(m) schematically show side cross-sectional views of a GLV-type device being fabricated in accordance with an embodiment of the present invention. FIGS. 2(a)–2(m) are not drawn to scale.

Figure 2A:
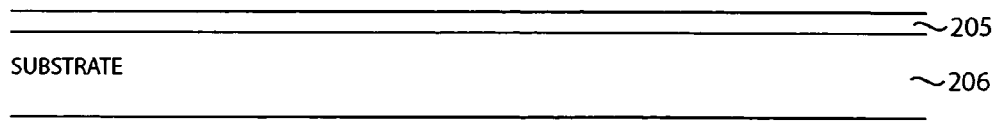
FIGS. 2(a)–2(m) schematically show side cross-sectional views of a GLV-type device being fabricated in accordance with an embodiment of the present invention.

In FIG. 2(a), an isolation layer 205 is deposited over a substrate 206. Substrate 206 may be a silicon substrate while isolation layer 205 may be a layer of silicon dioxide grown to a thickness of 1 μm by thermal oxidation. Isolation layer 205 isolates a subsequently deposited metal layer 207' from substrate 206.

Figure 2B:
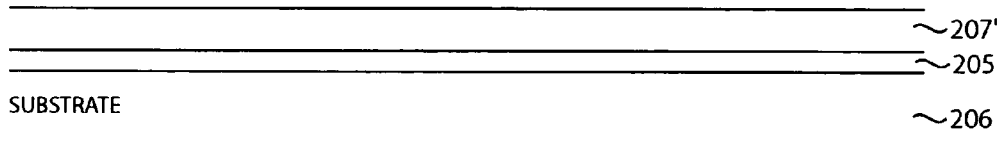

In FIG. 2(b), metal layer 207' is deposited over isolation layer 205. As discussed below, metal layer 207' may be a layer of titanium deposited to a thickness of about 1000 Angstroms (i.e., $1000 \times 10^{-10}$ m) by physical vapor deposition.

Figure 2C:
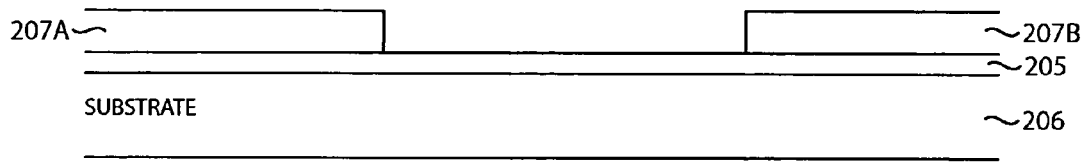

In FIG. 2(c), metallic electrodes 207 (i.e., 207A, 207B) are formed by patterning and etching metal layer 207'. Preferably, a metallic electrode 207 is of a metallic material that has good conductivity. For example, a metallic electrode 207 may have a conductivity less than 250 μΩ-cm. Additionally, a metallic electrode 207 is preferably of a material that is stable over the range of processing temperatures it will be subjected to. For example, a metallic electrode 207 preferably will not melt, sublimate, oxidize, peel, or adversely react with adjacent materials at temperatures up to about 900° C. Because a metallic electrode 207 also serves as an etch stop in a subsequent etching step for removing a sacrificial layer, metallic electrode 207 is preferably of a material that is not appreciably etched by the sacrificial layer etchant.

To help facilitate integration of metallic electrodes 207 in traditional integrated circuit factories, a metallic electrode 207 is preferably of a metallic material that is compatible with standard integrated circuit fabrication processes such as CMOS (Complementary Metal-Oxide Semiconductor). Likewise, a metallic electrode 207 is preferably formable using conventional patterning and etching techniques.

A metallic electrode 207 may be formed by (a) depositing a metal layer over a substrate, (b) patterning and etching the metal layer to form a metallic electrode, and (c) then changing the composition of the metallic electrode by reacting it with another material, referred to as a "source material", at relatively high temperature.

In one embodiment, metallic electrodes 207 comprise titanium nitride (TiN). A metallic electrode 207 of titanium nitride may be formed on isolation layer 205 by first depositing titanium to a thickness of about 1000 Angstroms by physical vapor deposition. The titanium may then be patterned and etched to form a metallic electrode. The formation of the metallic electrode may then be followed by an ammonia-based rapid thermal processing (RTP) at around 1050° C. for about 30 seconds. The ammonia in the rapid thermal process serves as a source material, providing nitrogen to the metallic electrode of titanium. That is, the ammonia reacts with the titanium to form titanium-nitride.

Forming a metallic electrode 207 of titanium-nitride by first patterning and etching a titanium layer and then exposing the titanium to a nitrogen source has several advantages. For one, the resulting titanium-nitride reacts with an isolation layer 205 of silicon dioxide to form titanium-oxide at their interface. This creates good adhesion between a metallic electrode 207 and an isolation layer 205. Additionally, by patterning and etching the titanium before reacting the titanium with ammonia, all sidewalls of a metallic electrode 207 are exposed to the ammonia, making the sidewalls rich with titanium-nitride.

Depending on the application, a metallic electrode 207 of titanium-nitride may also be formed by reactively sputtering titanium in a process chamber containing nitrogen.

Titanium-nitride has several properties that make it suitable as a metallic electrode 207 in the example fabrication process of FIGS. 2(a)–2(m). Titanium-nitride has good conductivity (about 50–100 μΩ-cm), is stable at temperatures at least up to about 1200° C., does not react with silicon (the material used as sacrificial layer in one embodiment) at temperatures at least up to about 900° C., is compatible with standard integrated circuit fabrication processes, has good adhesion, is optically smooth to light in the ultra violet (UV) to infra-red (IR) wavelengths. Additionally, titanium-nitride is not appreciably etched by a noble gas fluoride etchant, such as a xenon difluoride etchant used to remove a sacrificial layer of amorphous silicon in one embodiment. Thus, a metallic electrode 207 of titanium-nitride may also serve as a conductive etch stop in the amorphous silicon etch. In light of the present disclosure, those of ordinary skill in the art can use other metallic materials for specific applications. For example, titanium-tungsten-nitride (TiWN) or tungsten-silicide ($WSi_2$) may also be used as a metallic electrode material.

Figure 2D:
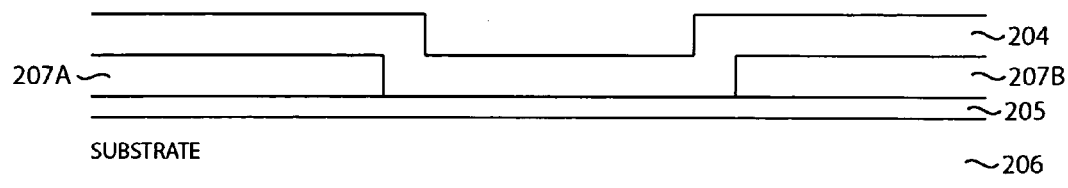

Continuing in FIG. 2(d), a protection layer 204 is deposited over the sample of FIG. 2(c). As described below, some metallic electrodes 207 may be used as a bottom metallic electrode under a ribbon while other metallic electrodes 207 may be used as a metal pad for electrically coupling a ribbon to a lead array (see FIG. 2(m)). In the example of FIGS. 2(a)–2(m), a metallic electrode 207 to be used as a bottom electrode is referred to as a "metallic electrode 207A", while a metallic electrode 207 to be used as a metal pad is referred to as a "metallic electrode 207B". Protection layer 204 protects a metallic electrode 207B during the etching of a metallic electrode 207A. In one embodiment, protection layer 204 is a layer of silicon dioxide deposited to a thickness of about 2000 Angstroms by plasma-enhanced chemical vapor deposition.

Figure 2E:
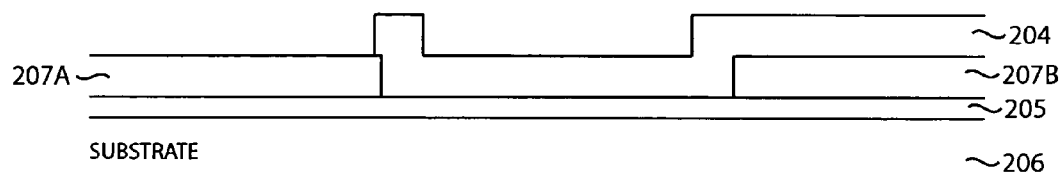

In FIG. 2(e), protection layer 204 is patterned and etched to expose a metal electrode 207A. In one embodiment, protection layer 204 is etched using an etchant comprising hydrofluoric acid (HF).

Figure 2F:
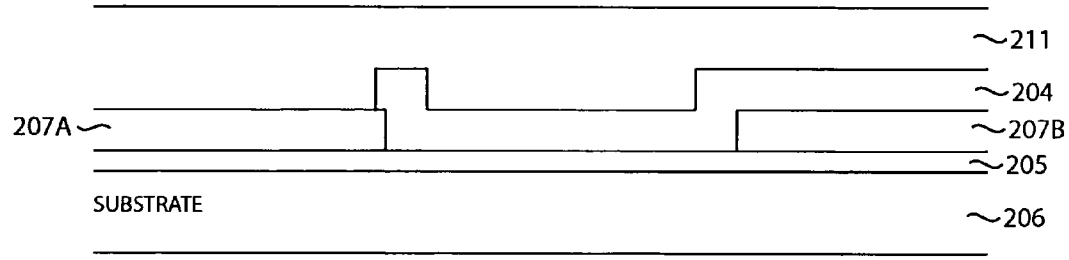

In FIG. 2(f), a sacrificial layer 211 is deposited over the sample of FIG. 2(e). In one embodiment, sacrificial layer 211 is a layer of amorphous silicon deposited to a thickness of about 1 μm to 3 μm by low pressure chemical vapor deposition at around 550° C. Sacrificial layer 211 will be subsequently removed to form an air gap 201 between a metallic electrode 207A and a ribbon 200 (see FIG. 2(m)).

Figure 2G:
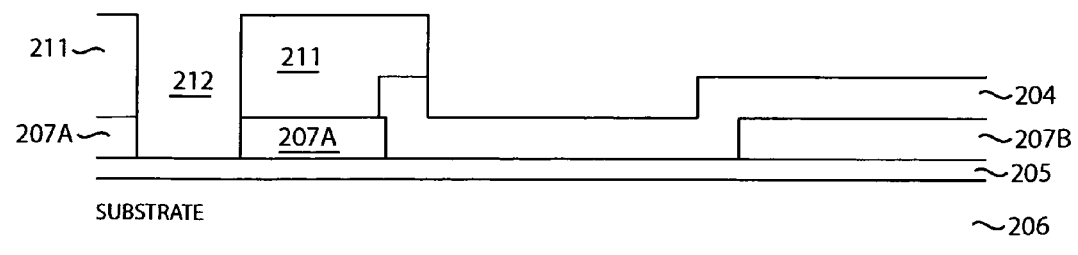

In FIG. 2(g), sacrificial layer 211 is patterned and etched to remove portions of sacrificial layer 211 not over a metallic electrode 207A and to dig a cavity 212. Cavity 212 is subsequently filled with ribbon material to securely anchor a ribbon 200.

Figure 2H:
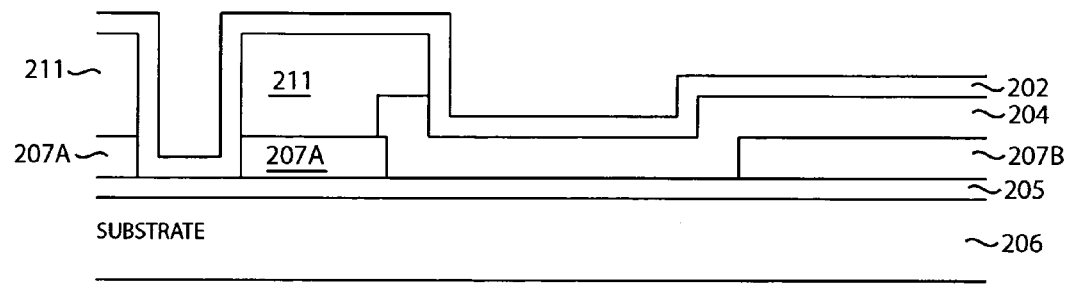

In FIG. 2(h), a ribbon material 202 is deposited over the sample of FIG. 2(g). Ribbon material 202 is preferably a resilient material that may be repeatedly flexed without breaking. In one embodiment, ribbon material 202 comprises silicon nitride deposited to a thickness of about 1000 Angstroms by low pressure chemical vapor deposition.

Figure 2I:
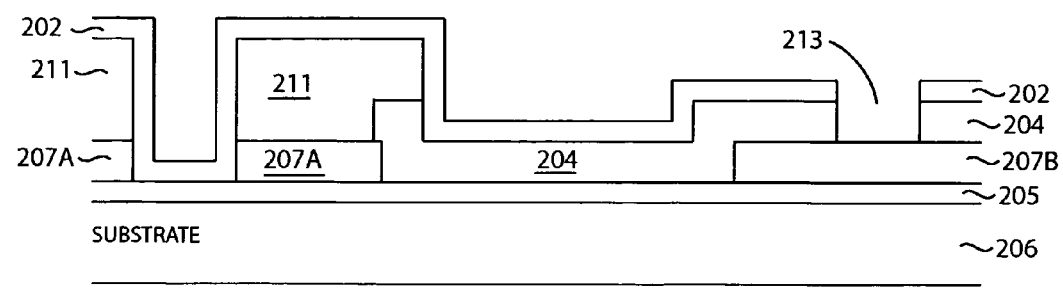

In FIG. 2(i), a via 213 is formed through ribbon material 202 and protection layer 204. Via 213 exposes a metallic electrode 207B. Via 213 is subsequently filled with a metal for coupling an external signal, such as a control signal, to a top electrode of a ribbon 200.

Figure 2J:
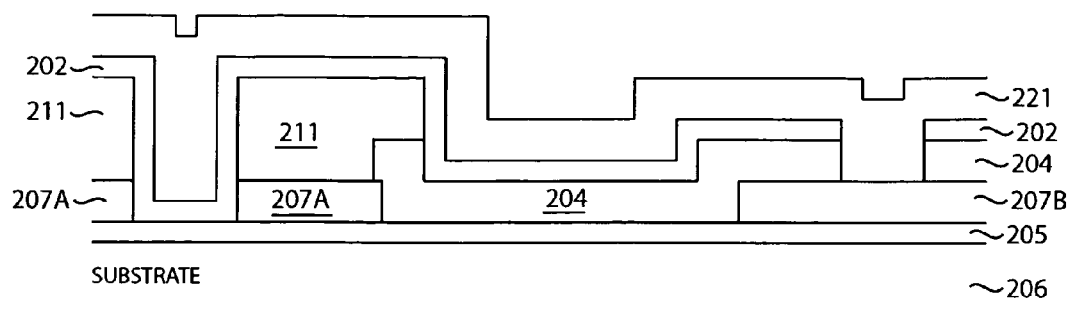

In FIG. 2(j), a metal layer 221 is deposited over the sample of FIG. 2(i). Metal layer 221 is relatively thick compared to a subsequently deposited metal layer 222 (see FIG. 2(l)). This allows the deposition of metal layer 221 to have adequate step coverage to fill via 213. In one embodiment, metal layer 221 comprises aluminum deposited to a thickness of about 0.5 μm by physical vapor deposition.

Figure 2K:
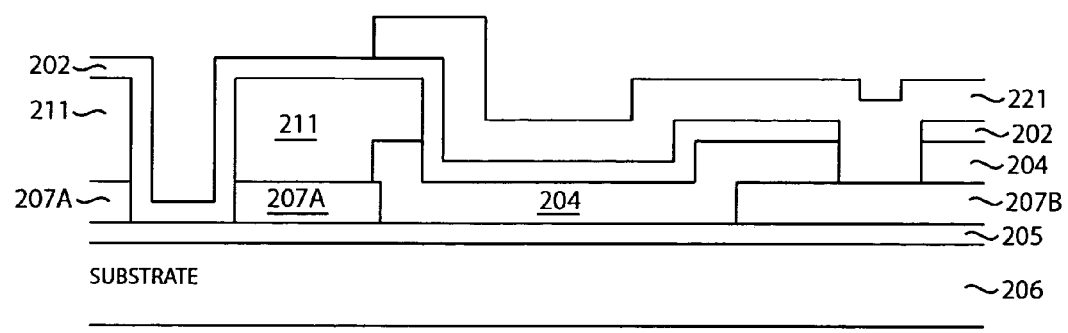

In FIG. 2(k), metal layer 221 is patterned and etched to remove portions of metal layer 221 over a metallic electrode 207A.

Figure 2L:
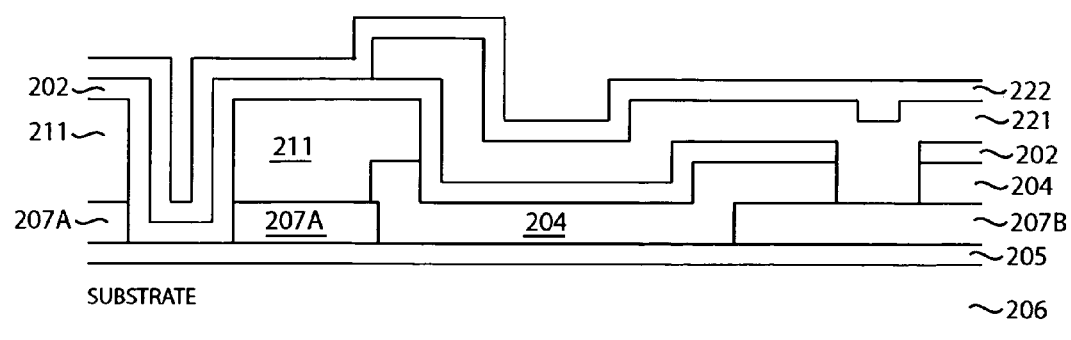

In FIG. 2(l), metal layer 222 is deposited over the sample of FIG. 2(k). Because portions of metal layer 222 will be part of a ribbon and will be flexed to modulate light, metal layer 222 is relatively thin compared to metal layer 221. In one embodiment, metal layer 222 comprises aluminum deposited to a thickness of 750 Angstroms by physical vapor deposition.

Figure 2M:
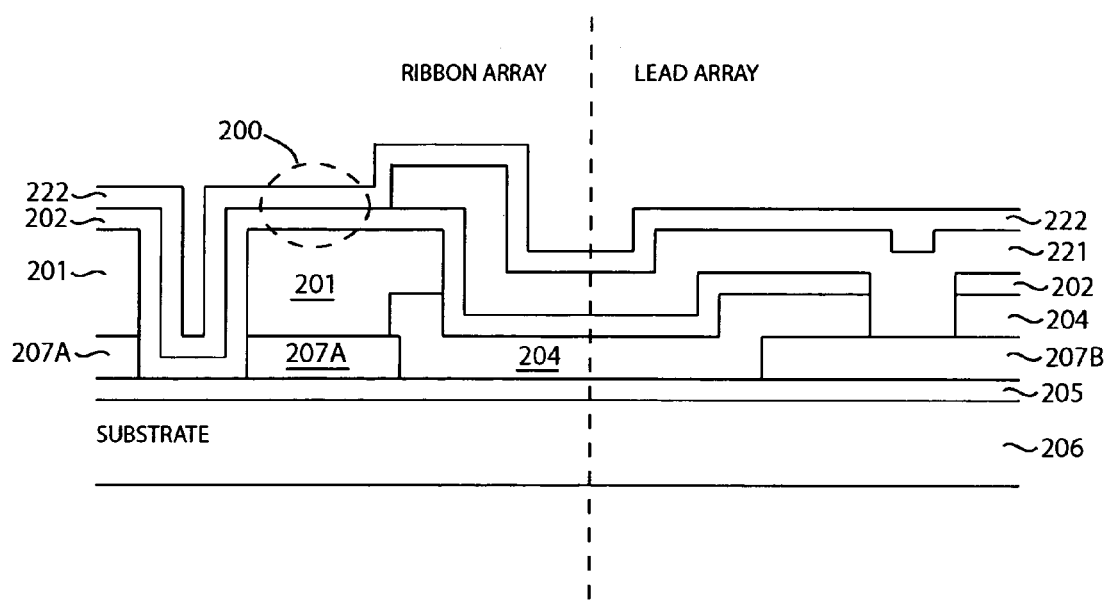

In FIG. 2(m), portions of sacrificial layer 211 between a metallic electrode 207A and ribbon material 202 are removed using the metallic electrode 207A as an etch stop. This etching step results in the formation of air gaps 201. In one embodiment, a sacrificial layer 211 of amorphous silicon is removed by placing the sample of FIG. 2(l) in an environment including a noble gas fluoride. Preferably, the noble gas fluoride includes xenon difluoride. Other noble gas fluorides that may be used include those of krypton and argon. It is to be noted that xenon difluoride has been used as an etchant in micro-electromechanical systems (MEMS). For example, U.S. Pat. No. 5,726,480 issued to Pister discloses the use of xenon difluoride in the fabrication of MEMS devices. U.S. application Ser. No. 09/952,626, entitled "MICROELECTRONIC MECHANICAL SYSTEM AND METHODS", filed by Mike Bruner on Sep. 13, 2001, also discloses the use of xenon difluoride as an etchant. The aforementioned disclosures by Pister and Bruner are incorporated herein by reference in their entirety.

As shown in FIG. 2(m), a metallic electrode 207A is formed under a ribbon 200 comprising ribbon material 202 and metal layer 222. A ribbon 200 is identified in FIG. 2(m) by a dashed circle. A ribbon 200 is an example of a "moveable structure" because it may be flexed towards a metallic electrode 207A upon application of a voltage difference between the metallic electrode 207A and the ribbon 200. Controlling the voltage difference allows modulation of light incident on metal layer 222.

In FIG. 2(m), metal layer 222 serves as a top electrode while a metallic electrode 207A serves as a bottom electrode. To apply a voltage difference between a ribbon 200 and a metallic electrode 207A, a voltage may be applied on metal layer 222 while substrate 206 is held at ground potential. Voltage may be applied on metal layer 222 by applying the voltage on a lead (e.g., interconnect line or wire; not shown) coupled to metallic electrode 207B, which is coupled to metal layer 221, which in turn is coupled to metal layer 222 as shown in FIG. 2(m). Metallic electrode 207B may be a metal pad coupled to a lead array that allows an external control signal, such as a voltage, to be applied on metal layer 222. Note that unlike a conventional ribbon, ribbon 200 employs a metallic bottom electrode with no dielectric coating to help prevent charge build up in the bottom electrode. Among other advantages, this allows for a more stable driving characteristic.

Figure 3:
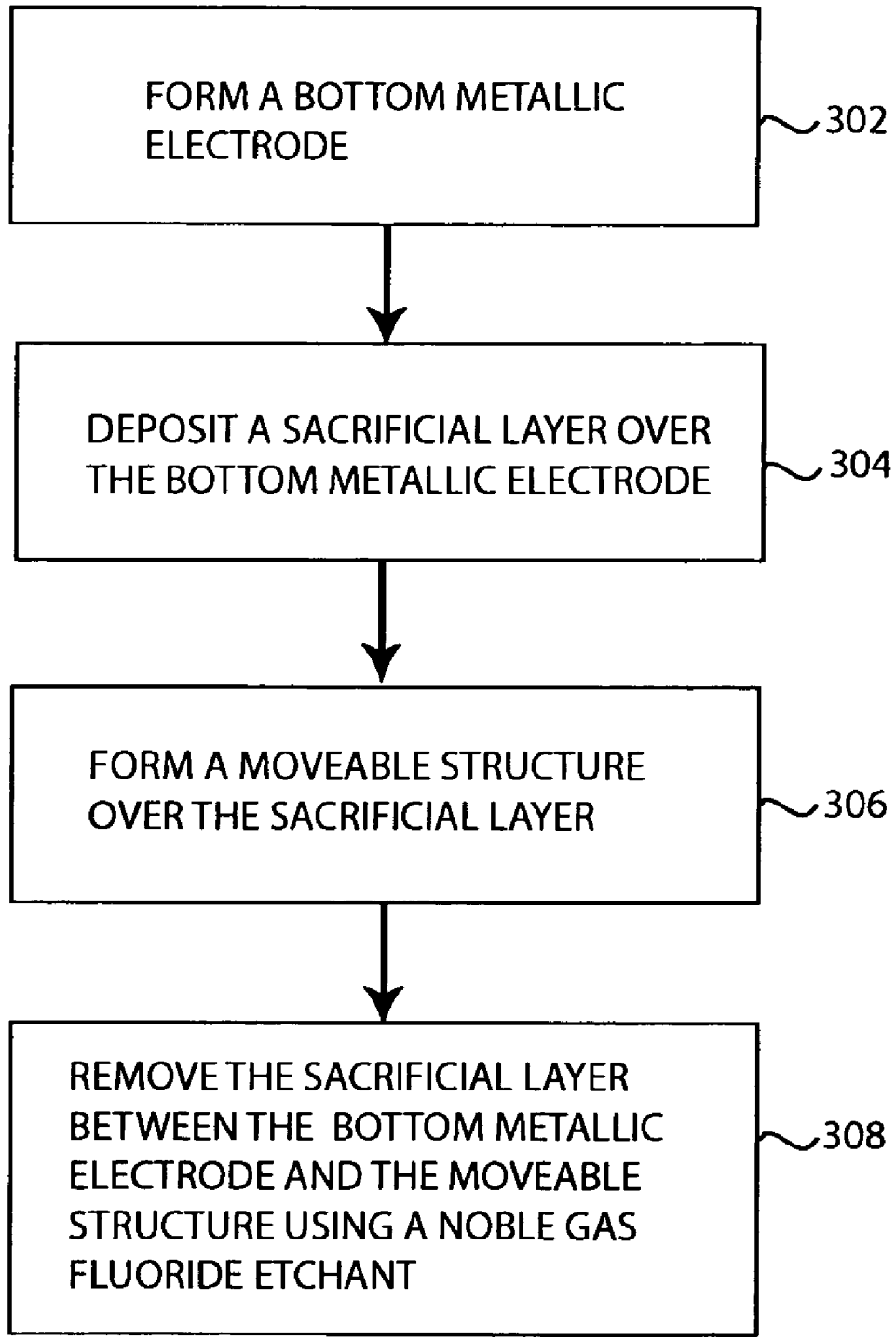
FIG. 3 shows a flow diagram of a method of forming a micro device in accordance with an embodiment of the present invention.

FIG. 3 shows a flow diagram of a method of forming a micro device in accordance with an embodiment of the present invention. In step 302, a bottom metallic electrode (e.g., a metallic electrode 207A) is formed over a substrate.

In step 304, a sacrificial layer (e.g., sacrificial layer 211) is deposited over the bottom metallic electrode.

In step 306, a moveable structure (e.g., ribbon 200) is formed over the sacrificial layer. The moveable structure may include a resilient structure (e.g., ribbon material 202) and a top metallic electrode (e.g., metal layer 222) over the resilient structure.

In step 308, the sacrificial layer between the moveable structure and the bottom metallic electrode is removed using a noble gas fluoride etchant. This results in an air gap that allows the moveable structure to flex towards the bottom metallic electrode upon application of a control signal, such as a voltage.

As discussed above, a metallic electrode may be formed by depositing a metal layer, etching the metal layer to form the metallic electrode, and then thermally processing the metallic electrode to change its composition. For example, in the previously described embodiment, metallic electrodes 207 may be formed by depositing a layer of titanium, etching that layer of titanium to form a metallic electrode, and then thermally processing the metallic electrode by an ammonia-based rapid thermal process (RTP). The ammonia in the rapid thermal process provides nitrogen to the metallic electrode, changing the composition of the metallic electrode to comprise titanium-nitride. That process results in a titanium-nitride electrode that has good adhesion to an underlying silicon dioxide interface and provides a metallic electrode having sidewalls that are rich with titanium-nitride.

A metallic electrode comprising titanium-nitride may also be formed using a dedicated titanium-nitride physical vapor deposition system (PVD). However, such dedicated titanium-nitride PVD systems are relatively costly to own and operate, and may not yield the same quality film. In contrast, embodiments of the present invention may be performed using a titanium PVD system and a rapid thermal process system, both of which are generally employed in the fabrication of other devices.

Figure 4:
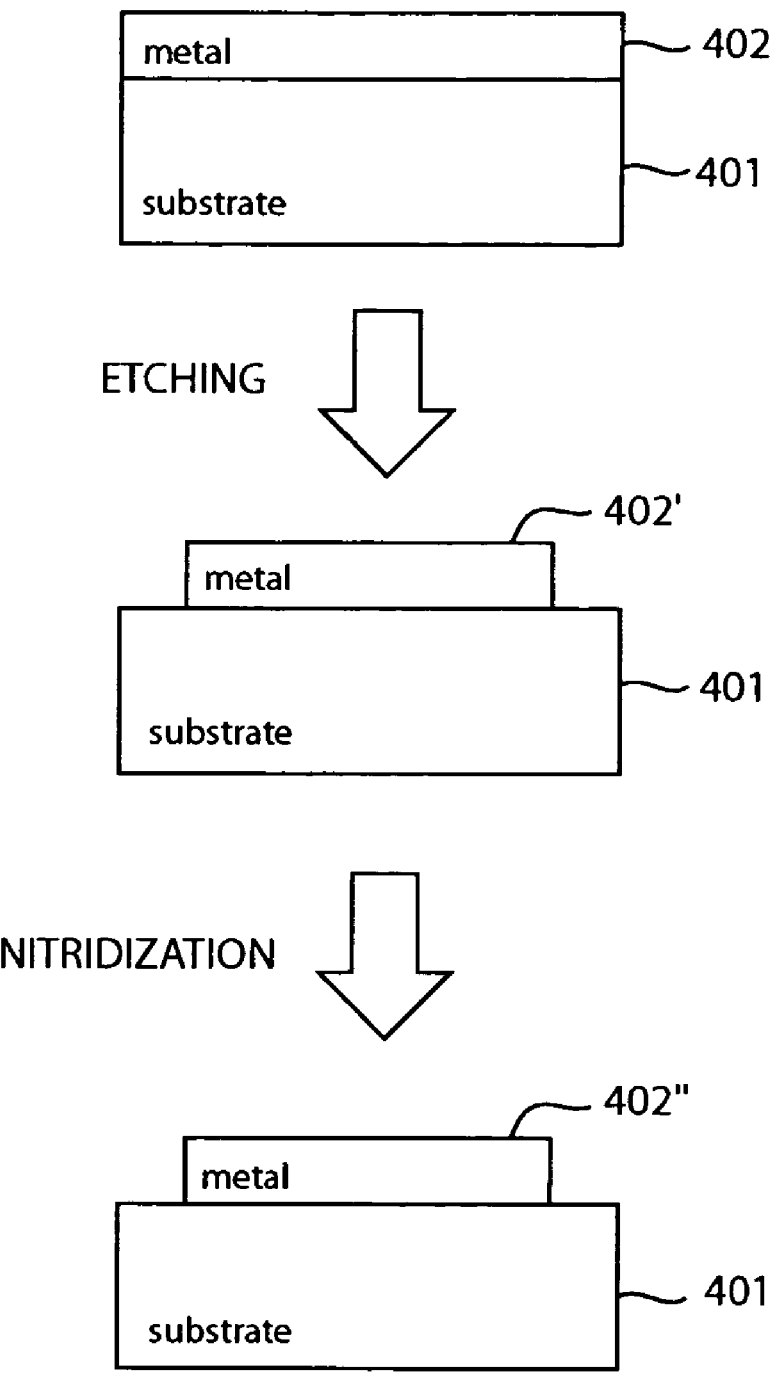
FIG. 4 pictorially illustrates a method of forming a metallic electrode in accordance with an embodiment of the present invention.

FIG. 4 pictorially illustrates the above-described process of forming a metallic electrode in accordance with an embodiment of the present invention. Beginning from the top of FIG. 4, a metal layer 402 is deposited over a surface, which may be that of a silicon substrate 401. Metal layer 402, which may be a metal or a metallized material, may be a refractory metal or a refractory metal alloy, such as tungsten or titanium-tungsten, for example. Metal layer 402 may be deposited by physical vapor deposition, which is also referred to as "sputtering." Metal layer 402 may also be formed using other systems that can deposit a blanket film of metal. Metal 402 is then etched to form a metallic electrode. In FIG. 4, metal layer 402 is relabeled as 402' to indicate that metal layer 402 has been etched to form an electrode. Thereafter, metal layer 402' is thermally processed in an environment comprising nitrogen to change the composition of metal layer 402' to include nitrogen. This step is also referred to as a "nitridization step." In one embodiment where metal layer 402 comprises titanium, metal layer 402 is thermally processed by rapid thermal processing in an ammonia environment at a temperature of 1050° C. for about 30 seconds. The ammonia-based rapid thermal process may also be performed at a temperature between about 700° C. to 1100° C. The flow rate of the nitrogen source (e.g. ammonia) into the RTP chamber may be about 4 sclm, for example. The flow rate of the nitrogen source and the process time depend on the selected temperature and other particulars of the application. For example, the nitridization step may be also performed on a blanket film of titanium by first ramping the RTP chamber temperature at a rate of 50° C./sec from ambient to 460° C., holding the temperature at 460° C. for 30 seconds, ramping the temperature at a rate of 50° C./sec from 460° C. to 875° C., and holding the temperature at 875° C. for 60 seconds. In FIG. 4, metal layer 402' is relabeled as 402" to indicate that its composition has been changed to include nitrogen.

In the example of FIG. 4, the nitridization step transforms metal layer 402 into a conductive metallized ceramic. For example, in the case where metal 402 comprises titanium, the resulting metal layer 402" (after nitridization of metal layer 402') comprises titanium-nitride. Conductive metallized ceramics other than titanium-nitride may also be formed using this process. This process may also be used to form, without limitation, titanium-tungsten-nitride (TiWN) or tungsten-nitride (WN), for example. Metal layer 402 prior to nitridization would be titanium-tungsten in the case of TiWN; metal layer 402 prior to nitridization would be tungsten in the case of WN.

Figure 5:
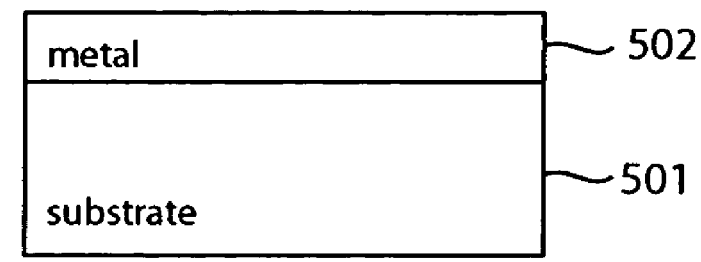
FIG. 5 pictorially illustrates a method of fabricating a metallic electrode in accordance with an embodiment of the present invention.
Figure 5:
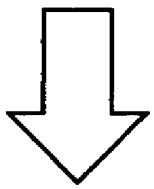
Figure 5:
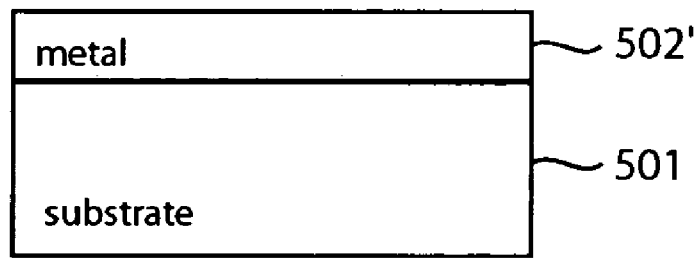
Figure 5:
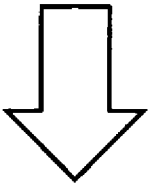
Figure 5:
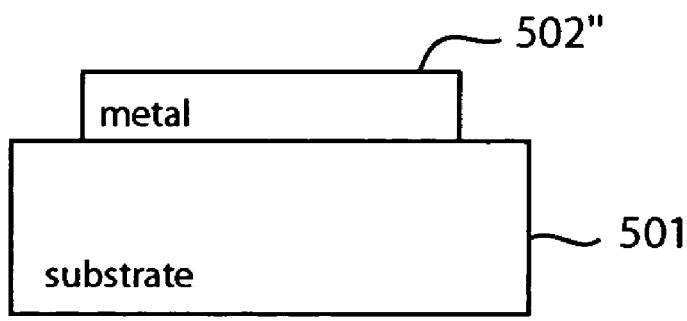

FIG. 5 pictorially illustrates another method of fabricating a metallic electrode in accordance with an embodiment of the present invention. The method illustrated in FIG. 5 is similar to that in FIG. 4 except that the metal is nitridized prior to being etched into an electrode. Beginning from the top of FIG. 5, a metal layer 502 (e.g., a refractory metal or refractory metal alloy) may be deposited over a silicon substrate 501 by physical vapor deposition, for example. Metal layer 502 then undergoes a nitridization step to change the composition of metal layer 502 to include nitrogen. The nitridization step may be an ammonia-based rapid thermal process, for example. The nitridization step changes the composition of metal layer 502 to comprise a conductive metallized ceramic. In FIG. 5, metal layer 502 is relabeled as 502' to indicate a metal layer 502 after nitridization. For example, in the case where metal layer 502 comprises titanium, metal layer 502' comprises titanium-nitride. Thereafter, metal layer 502' is etched to form a metallic electrode. In FIG. 5, metal layer 502 is relabeled as 502" to indicate a metal layer 502 after the etching step.

An advantage of the method in the example of FIG. 5 is that the inert, conductive metallized ceramic is formed prior to forming the metallic electrode, thereby helping prevent unwanted etching of the metal layer. In the case where metal layer 502 comprises titanium, the composition of metal layer 502 is transformed to titanium-nitride prior to exposing metal layer 502 to corrosive chemicals that could etch metals such as titanium. Hydrofluoric acid and hydroxyl amine-based chemicals are used in CMOS manufacturing and are known to etch titanium.

As can be appreciated, embodiments of the present invention may be employed to fabricate metallic electrodes having a film composition that is substantially uniform along all exposed areas of the metallic conductor, including the sidewalls. Embodiments of the present invention are thus especially useful in the fabrication of light modulator devices. In that application, the metallic electrodes allow for improved operation stability and drive characteristics by minimizing charge build up on the electrodes.

Figure 6A:
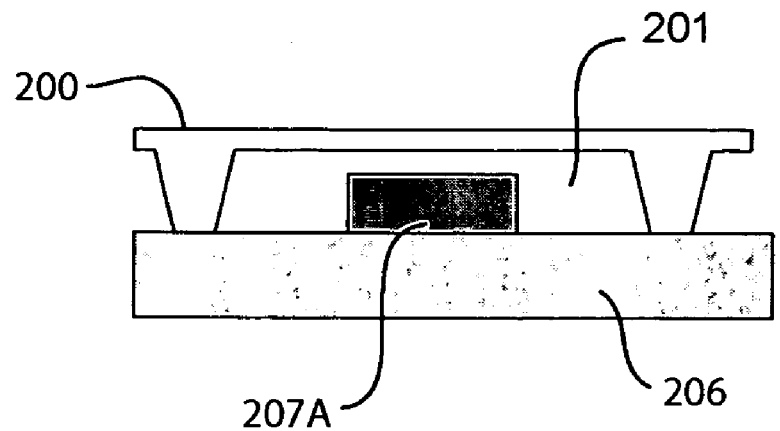
FIGS. 6(a) and 6(b) pictorially illustrate the operation of a light modulator in accordance with an embodiment of the present invention.
Figure 6B:
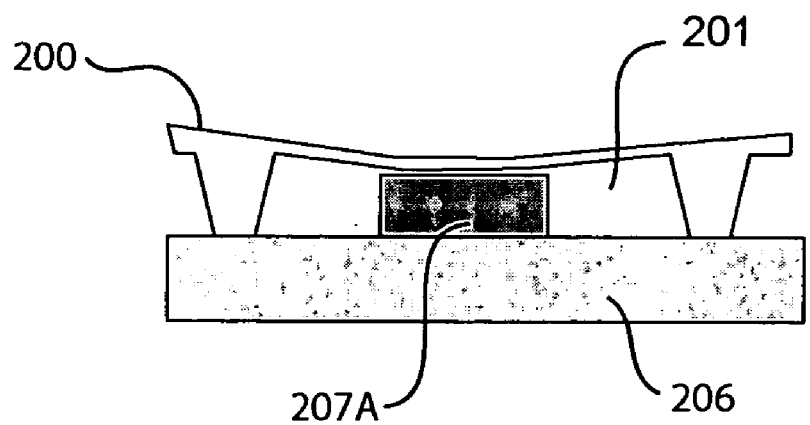

FIGS. 6A and 6B pictorially illustrate the deflection of a ribbon 200 of a light modulator (see also FIG. 2(m)), in accordance with an embodiment of the present invention. FIG. 6(a) shows ribbon 200 in an undeflected state prior to the application of a voltage thereon. Air gap 201 is the resulting air gap after the etching of a sacrificial layer, for which metallic electrode 207A was used as an etch stop to protect an underlying isolation layer (not shown in FIG. 6(a); see isolation layer 205 in FIG. 2(m)). FIG. 6(b) shows ribbon 200 when a voltage is applied on ribbon 200, thereby creating a potential difference between ribbon 200 and metallic electrode 207A. The potential difference deflects ribbon 200 towards metallic electrode 207A. Charge build-up on metallic electrode 207A is minimized because metallic electrode 207A is conductive. This improves the drive characteristic of the light modulator.

Table 1 shows a summary of nitridization experiments conducted on 1000 Angstroms titanium films prior to etching them into electrodes. In Table 1, the "Rs" stands for sheet resistance. For comparison purposes, note that the sheet resistance of a 1000 Angstrom titanium film formed on thermal oxide is about 8.15 ohms/sq. Also, with regards to reflectivity, the reflectivity of titanium is about 135% (436 nm wavelength, silicon reference). The post-nitridization reflectivities shown in Table 1 are given in terms of percentage with respect to titanium. As shown in Table 1, the nitridization step lowers the reflectivity of the resulting titanium-nitride, indicating an increase in nitrogen content as the nitridization temperature is increased. In the experiment, the inventors found that films that were nitridized at temperatures of 1050° C. and 1100° C. were dark-amber in appearance, which is indicative of a nitrogen-rich metallic film. These films were found to be resistant to attack by hydrofluoric acid, hydroxyl amine based chemistries, and gas-phase xenon difluoriude.

TABLE 1

| Experiment | Rs for TiN, ohms/sq (Std. deviation) | Nitridization temperature in ammonia atmosphere | Post-nitridization reflectivity |
|---|---|---|---|
| 1 | 18.6 (0.229) | 610° C. | |
| 2 | 22.96 (1.06) | 800° C. | ~97% |
| 3 | 12.36 (0.396) | 900° C. | ~70% |
| 4 | 9.31 (0.548) | 960° C. | |
| 5 | 8.85 (0.292) | 1050° C. | ~35% |
| 6 | 5.72 (0.397) | 1100° C. | ~20% |

Figure 7:
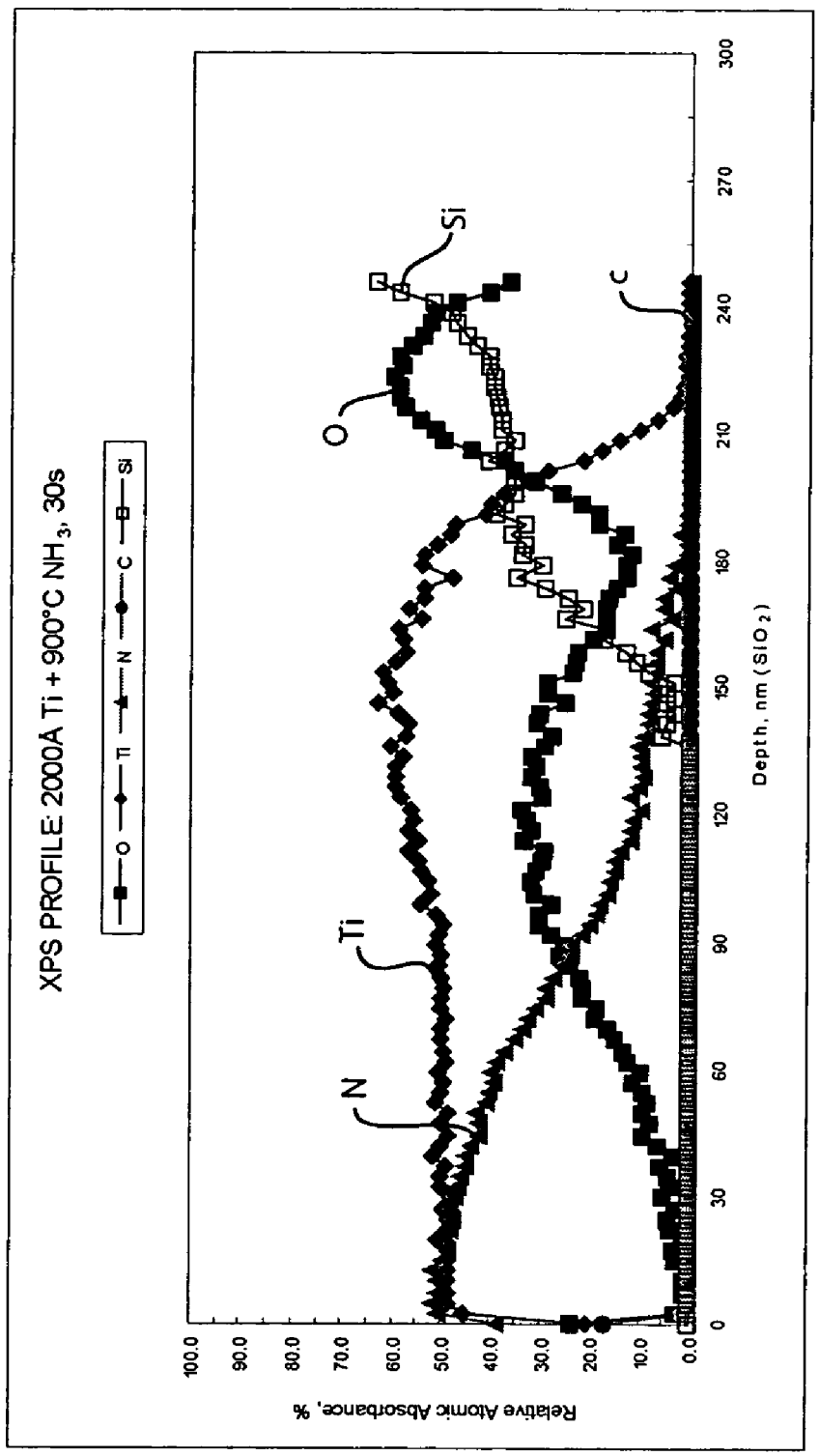
FIG. 7 shows the results of an x-ray photoelectron spectroscopy analysis performed on a metallic electrode in accordance with an embodiment of the present invention.

As part of the experiment, a 2000 Angstrom thick titanium film was subjected to a nitridization step at 900° C. (similar to Experiment 3 in Table 1). That titanium film was then analyzed by x-ray photoelectron spectroscopy (XPS). The results of the XPS are shown in FIG. 7. The XPS analysis indicates that the outer ~500 Angstroms of the 2000 Angstrom titanium film were nitrogen rich and approximately 1:1 Ti:N stoichiometry.

Figure 8A:
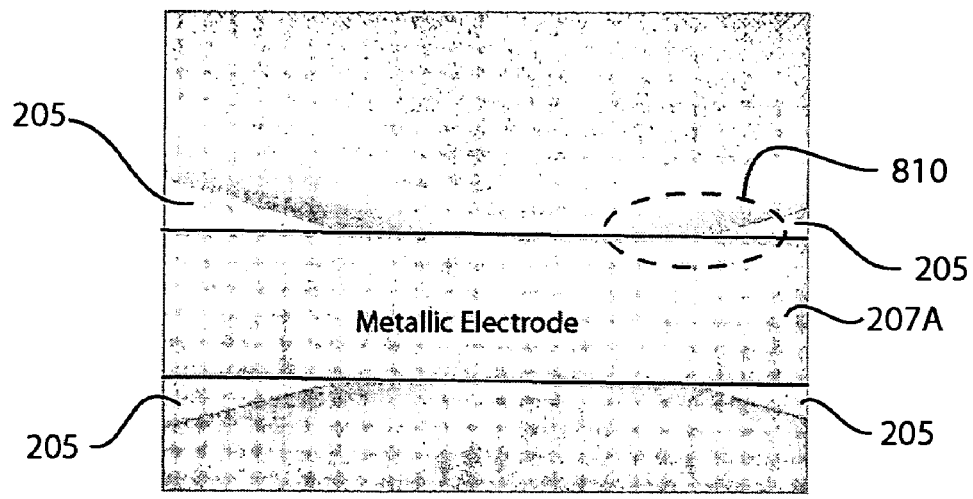
FIG. 8(a) shows an optical microscope photograph of a top view of a metallic electrode in accordance with an embodiment of the present invention.
Figure 8B:
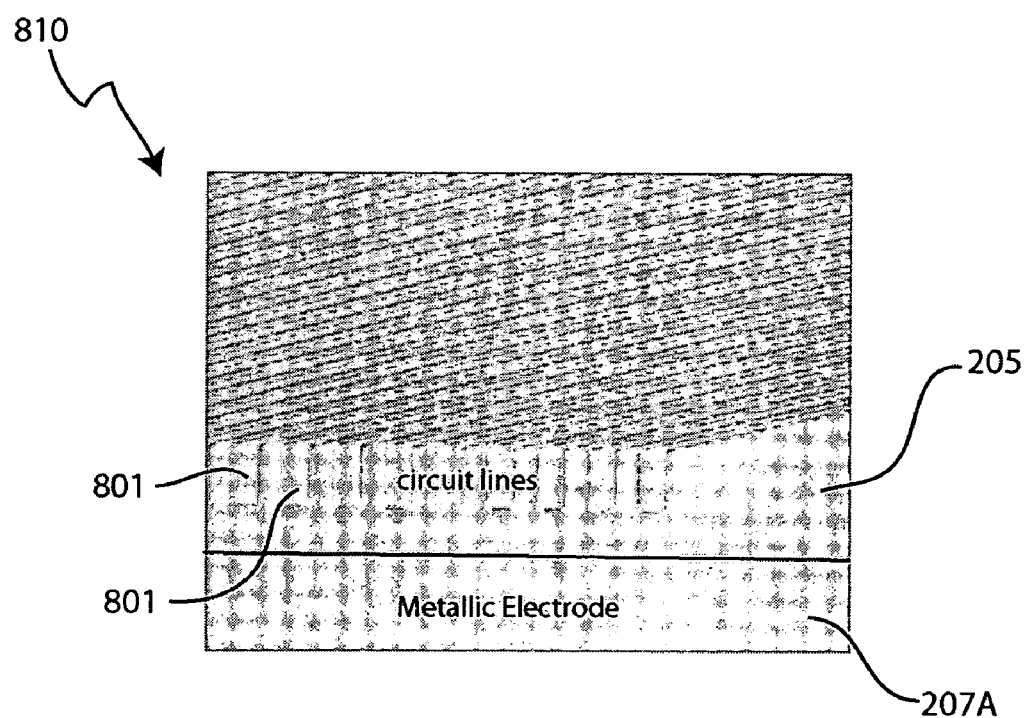
FIG. 8(b) shows a magnified view of the photograph of FIG. 8(a).

Also as part of the experiment, patterned (i.e. etched) film studies were conducted by subjecting patterned titanium metallic electrodes to a rapid thermal process at 1050° C., $NH_3$ flow rate of 4 sclm in the RTP chamber, for 30 seconds. This resulted in uniform nitridization of the titanium metallic electrode to form titanium-nitride. Adhesion of the titanium metallic electrode to an underlying silicon dioxide was found to be excellent. The electrical conductivity of the titanium blanket film prior to patterning was about 8 ohms/sq using a 4-point probe measurement. After patterning, the titanium metallic electrode was found to be resistant to attack by hydrofluoric acid, hydroxyl amine based chemistries, and gas-phase xenon difluoriude used in the fabrication of light modulators. FIG. 8(a) shows an optical microscope photograph of a top view of a metallic electrode 207A of a light modulator (see also FIG. 2(m)), in accordance with an embodiment of the present invention. In FIG. 8(a), the metallic electrode 207A of titanium-nitride is shown as over an isolation layer 205 of silicon dioxide. FIG. 8(b) shows a magnified view of the portion labeled as 810 in FIG. 8(a). As shown in FIG. 8(b), the metallic electrode 207A has excellent adhesion with the isolation layer 205. Also shown in FIG. 8(b) are circuit lines 801 of the light modulator.

Figure 9A:
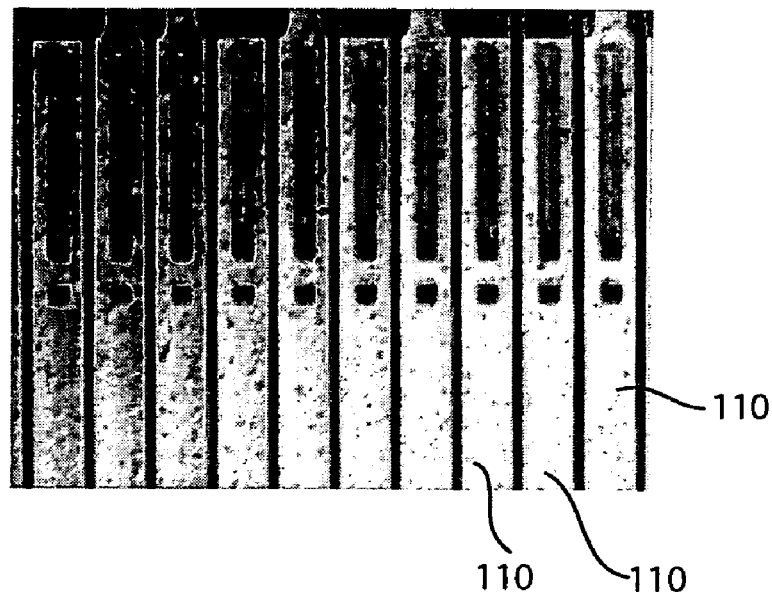
FIG. 9(a) shows an optical microscope photograph of the ribbons of a conventional light modulator.
Figure 9B:
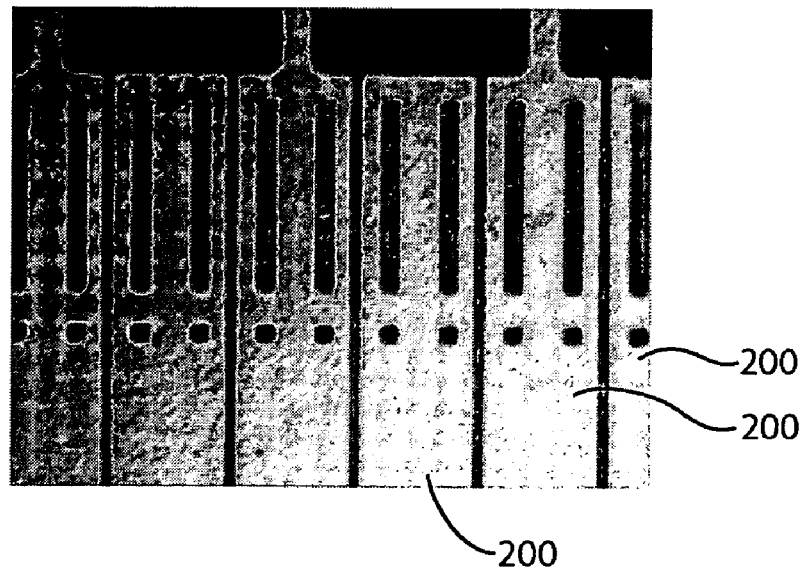
FIG. 9(b) shows an optical microscope photograph of the ribbons of a light modulator in accordance with an embodiment of the present invention.

Another advantage of the disclosed methods of forming a metallic electrode is related to the reduction of the ribbon Ra factor (also referred to as "roughness"), specifically in comparison to a conventional doped polysilicon electrode with oxide etch stop. The conventional polysilicon electrode with a thermally grown oxide etch stop has a higher Ra factor (or is "rougher") due to the use of chemical vapor deposition (CVD) processes where an accelerated deposition or growth can occur at surface nucleation sites, resulting in the formation of "nodules." FIG. 9(a) shows an optical microscope photograph of the top surface of ribbons 110 (only a few are labeled for clarity; see FIG. 1) employing a conventional polysiicon electrode with an oxide etch stop. As is evident from FIG. 9(a), the "roughness" associated with the aforementioned nodules is translated through the subsequent materials deposited to form the sacrificial layer and ribbons. Because the conductive etch stop described in this disclosure may be formed from a sputter deposited titanium film, the resulting titanium-nitride metallic electrode has a lower Ra factor. FIG. 9(b) shows an optical microscope photograph of the top surface of ribbons 200 (only a few are labeled for clarity) with titanium-nitride electrode/etch stop in accordance with an embodiment of the present invention. As shown in FIG. 9(b), a light modulator with a titanium-nitride metallic electrode/etch stop is much "smoother" than that with a polysilicon electrode. The lower Ra factor resulting from the use of a titanium-nitride metallic electrode improves the optical quality of the light modulator by decreasing the light scattered from reflective surfaces.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

The invention claimed is:

1. A method of fabricating a MEMS device, the method comprising:
   forming a metal layer over a substrate;
   patterning the metal layer to form an electrode of the MEMS device, the electrode serving as an etch stop in a subsequent etching step of a sacrificial layer; and
   changing a composition of the electrode by thermally processing the electrode in an environment comprising nitrogen.

2. The method of claim 1 wherein the environment includes ammonia.

3. The method of claim 1, wherein the electrode comprises a bottom electrode of a light modulator.

4. The method of claim 1, wherein the metal layer comprises titanium and the composition of the electrode is changed to comprise titanium-nitride.

5. The method of claim 1, wherein the composition of the electrode is changed to that of a material selected from a group comprising TiWN and WN.

6. The method of claim 1, wherein changing the composition of the electrode comprises performing a rapid thermal process on the metallic electrode to form a conductive metallized ceramic material.

7. The method of claim 1, wherein depositing the metal layer comprises depositing the metal layer by physical vapor deposition (PVD).

8. The method of claim 1 further comprising:
   prior to depositing the metal layer, depositing an isolation layer over the substrate.

9. A method of forming a metallic electrode, the method comprising:
  forming a metal layer over a surface;
  thermally processing the metal layer with a nitrogen source to change the composition of the metal layer to a conductive metallized ceramic;
  forming a sacrificial layer over the metal layer; and
  etching the sacrificial layer using the metal layer as an etch stop protecting an underlying layer of material.

10. The method of claim 9 further comprising:
  etching the metal layer to form a metallic electrode prior to thermally processing the metal layer.

11. The method of claim 9 wherein thermally processing the metal layer changes the composition of the metal layer to that of a material selected from a group consisting of TiWN and WN.

12. The method of claim 9 wherein the metal layer comprises titanium and thermally processing the metal layer changes the composition of the metal layer to titanium nitride.

13. The method of claim 9 wherein the metal layer is deposited by physical vapor deposition and thermally processed by rapid thermal processing.

14. The method of claim 9 wherein the sacrificial layer comprises silicon.

15. The method of claim 9 wherein the sacrificial layer is etched using a noble gas fluoride.

16. A method of forming a metallic electrode, the method comprising:
  forming a layer of titanium over a surface;
  etching the layer of titanium to form a metallic electrode;
  thermally processing the metallic electrode in an environment including ammonia to change the composition of the metallic electrode to comprise titanium nitride;
  forming a sacrificial layer comprising silicon over the metallic electrode; and
  etching the sacrificial layer using a gaseous etchant using the metallic electrode as an etch stop.

17. The method of claim 16 wherein the gaseous etchant comprises a noble gas fluoride.

18. The method of claim 16 wherein etching the sacrificial layer using the gaseous etchant creates an air gap separating a resilient movable structure and the metallic electrode.

* * * * *